US012719468B2

(12) United States Patent
Claverie-Belliard

(10) Patent No.: US 12,719,468 B2
(45) Date of Patent: Aug. 25, 2026

(54) INTEGRATED CIRCUIT FUNCTIONAL AT AND CAPABLE OF WITHSTANDING A MAXIMUM VOLTAGE GREATER THAN A RATED VOLTAGE, AND CORRESPONDING METHOD

(71) Applicant: STMicroelectronics International N.V., Geneva (CH)

(72) Inventor: Isabelle Claverie-Belliard, Greasque (FR)

(73) Assignee: STMicroelectronics International N.V., Geneva (CH)

( * ) Notice: Subject to any disclaimer, the term of this patent is extended or adjusted under 35 U.S.C. 154(b) by 38 days.

(21) Appl. No.: 18/761,050

(22) Filed: Jul. 1, 2024

(65) Prior Publication Data

US 2025/0023562 A1 Jan. 16, 2025

(30) Foreign Application Priority Data

Jul. 11, 2023 (FR) ...................................... 2307446

(51) Int. Cl.
*H03K 17/10* (2006.01)
*H03K 17/081* (2006.01)
*H03K 17/22* (2006.01)

(52) U.S. Cl.
CPC ..... *H03K 17/102* (2013.01); *H03K 17/08104* (2013.01); *H03K 17/223* (2013.01)

(58) Field of Classification Search
CPC .......... H03K 17/102; H03K 17/08104; H03K 17/223
See application file for complete search history.

(56) References Cited

U.S. PATENT DOCUMENTS

| | | | | |
|---|---|---|---|---|
| 9,887,620 | B2 * | 2/2018 | Li .......................... | H02M 1/36 |
| 11,387,647 | B2 * | 7/2022 | Ramos ................. | H10D 89/819 |
| 11,569,819 | B1 | 1/2023 | Shah et al. | |
| 2007/0279096 | A1 | 12/2007 | Chong et al. | |
| 2022/0166215 | A1 | 5/2022 | Ramos | |

* cited by examiner

*Primary Examiner* — Menatoallah Youssef
*Assistant Examiner* — Colleen J O Toole
(74) *Attorney, Agent, or Firm* — Seed Intellectual Property Law Group LLP

(57) ABSTRACT

Provided is an integrated circuit that includes: a terminal designed to receive a signal at a rated voltage level which can rise to a maximum voltage level; an output circuit including a first transistor and a second transistor coupled in series between the terminal and an output stage; and a protection circuit designed to generate a first voltage controlling the first transistor, and a second voltage controlling the second transistor. In an activated state, the first voltage and the second voltage are obtained by dividing the voltage level of said terminal. In a deactivated state, the first voltage is obtained by the voltage level of said terminal, and the second voltage is obtained by the level of a control voltage minus a threshold voltage of a protection transistor.

17 Claims, 6 Drawing Sheets

[Fig. 1]
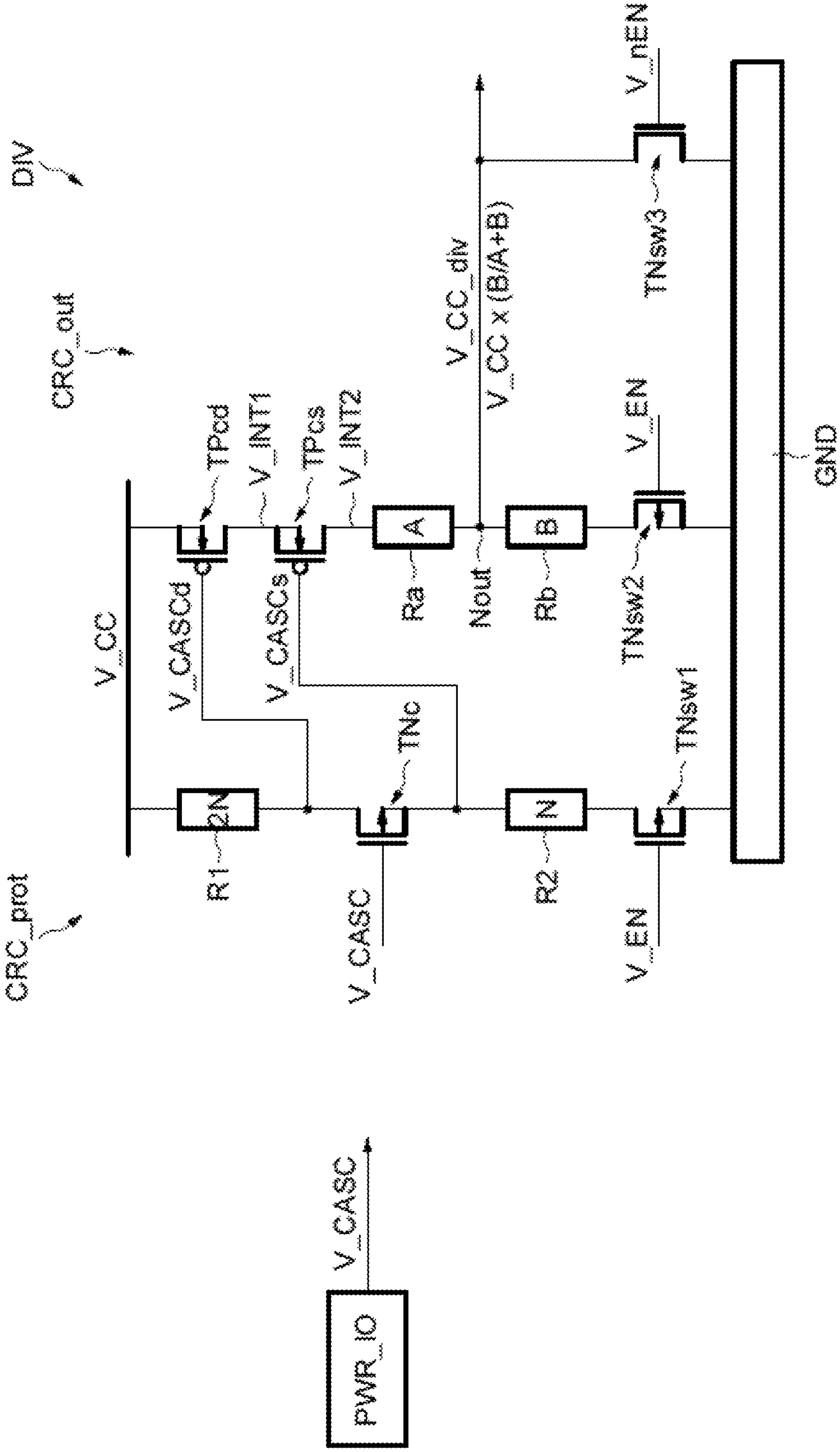

[Fig. 2]
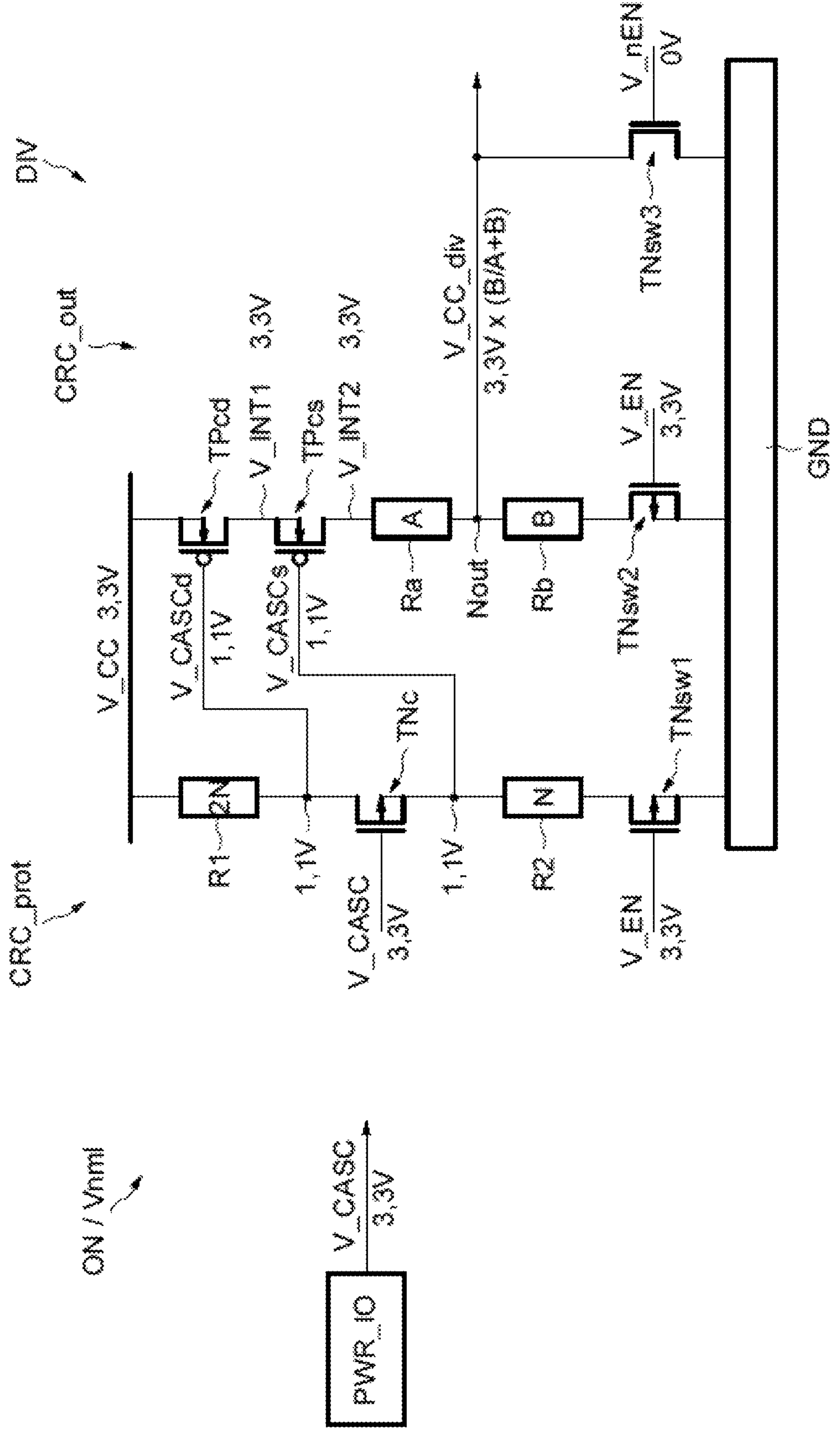

[Fig. 3]
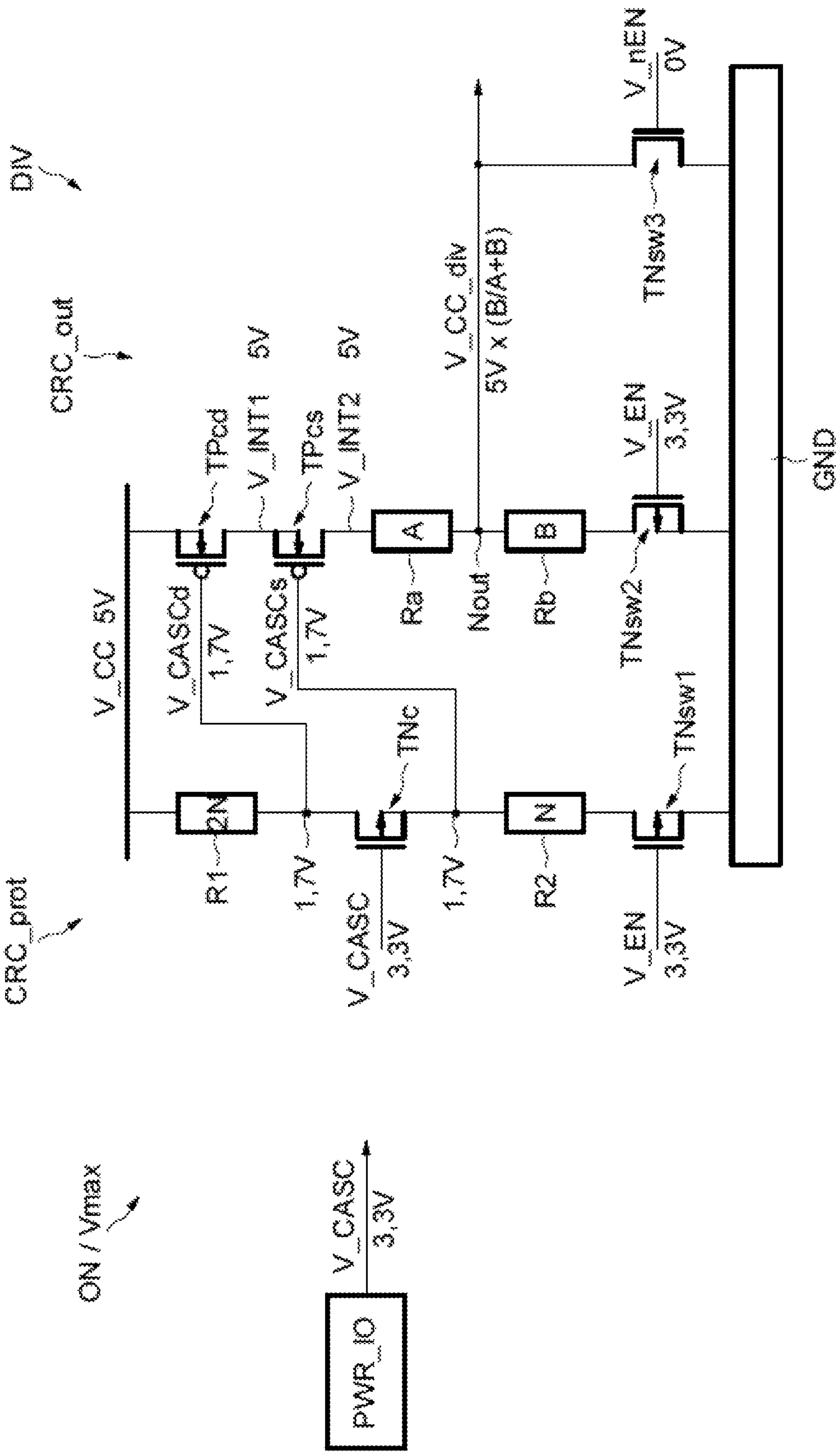

[Fig. 4]
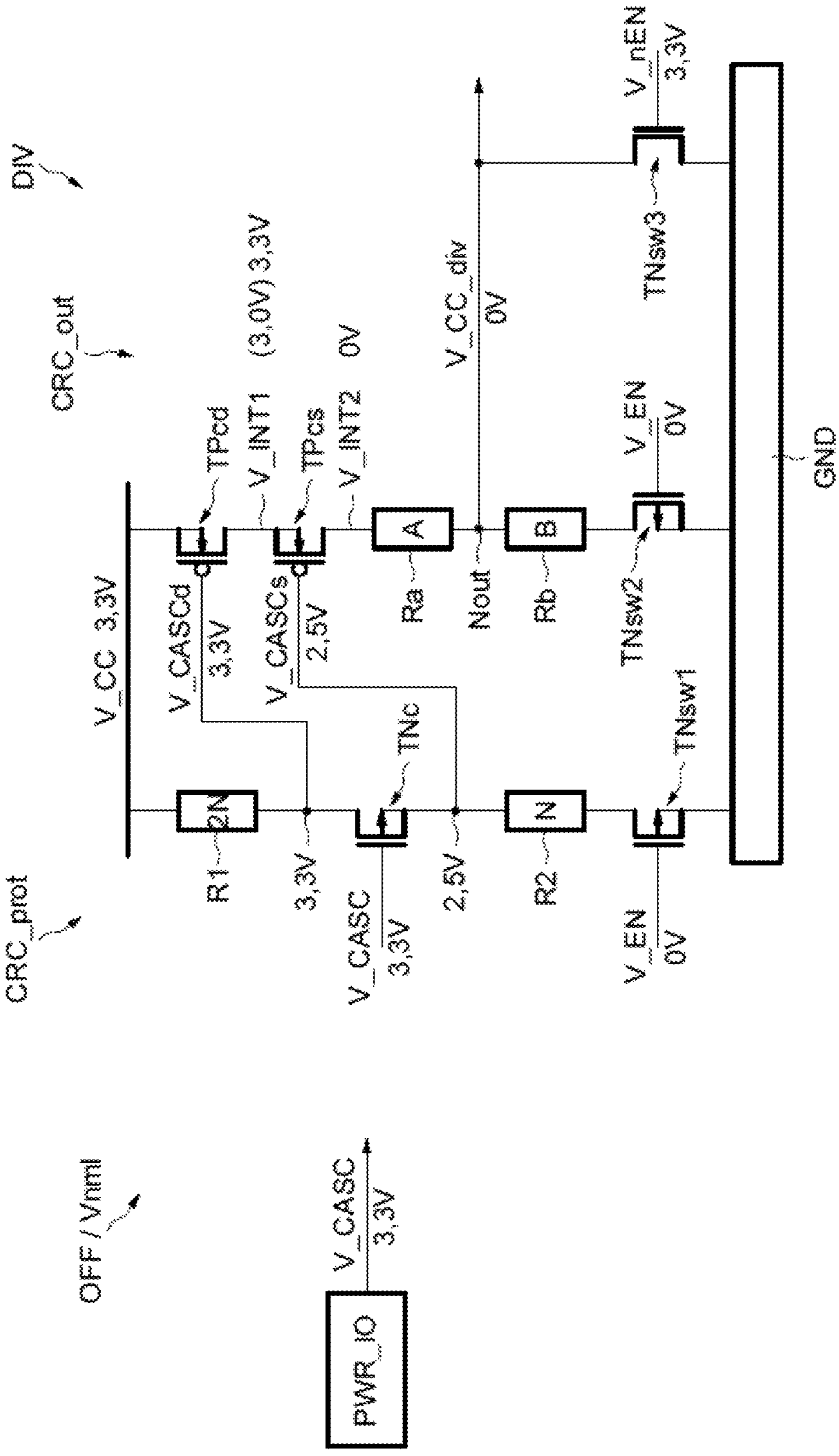

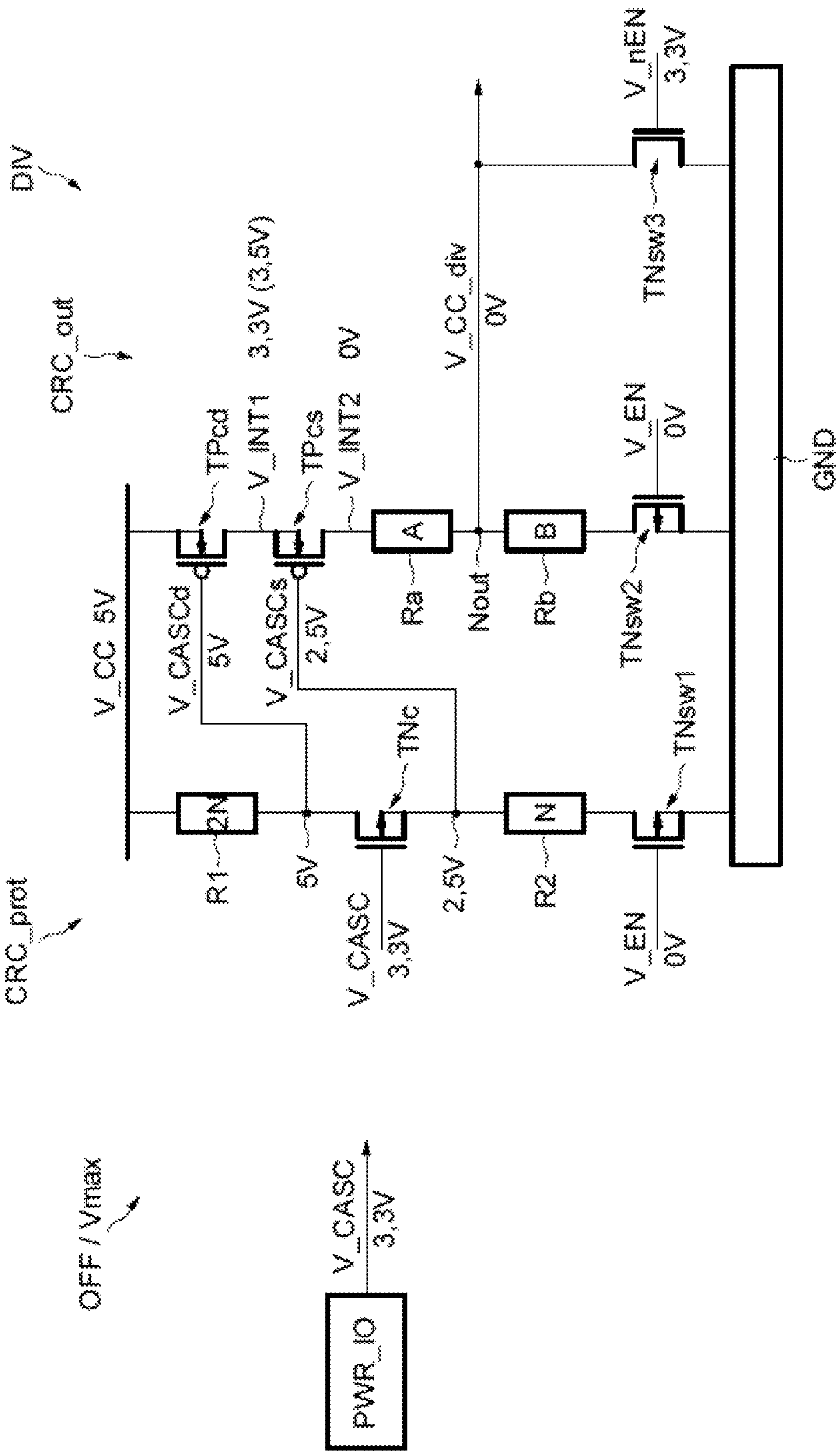
[Fig. 5]
DIV
CRC_out
3,3V (3,5V)
0V
V_CC_div
0V
V_nEN
3,3V
TNsw3
CRC_prot
V_CC 5V
V_CASCd
5V
V_CASCs
2,5V
TPcd
V_INT1
TPcs
V_INT2
A
Ra
Nout
B
Rb
TNsw2
V_EN
0V
GND
TNsw1
TNc
2N
R1
5V
V_CASC
3,3V
2,5V
N
R2
V_EN
0V

[Fig. 6]
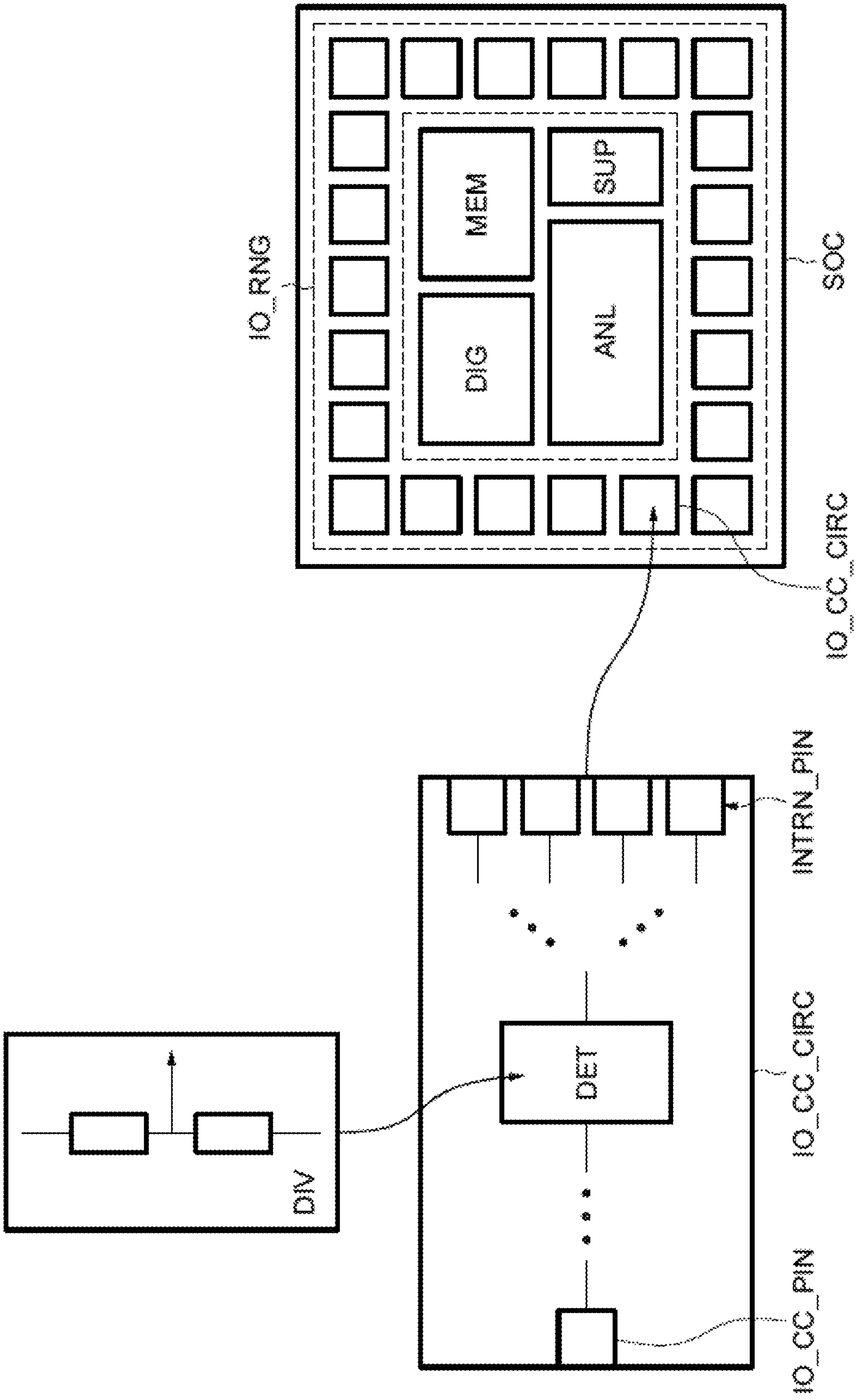

INTEGRATED CIRCUIT FUNCTIONAL AT AND CAPABLE OF WITHSTANDING A MAXIMUM VOLTAGE GREATER THAN A RATED VOLTAGE, AND CORRESPONDING METHOD

BACKGROUND

Technical Field

Embodiments and implementations relate to integrated circuits, in particular circuit design with respect to operating and tolerance constraints at a maximum voltage greater than a rated voltage, such as in USB-C port I/O device circuits.

Description of the Related Art

In particular, the USB-C provides a "power delivery" mode, usually referred to as "PD", which uses a channel CC1 to negotiate the power supply between the connected devices. In this context, there is a detection solution for voltage levels that require a divide-by-three solution for the channel CC1 pin. A small divider circuit must be able to guarantee operation that is functional at and capable of withstanding a maximum voltage of 5 V (volts).

Functional at 5 V means that when the USB-C port I/O circuit is activated, the circuit connected to the external terminal CC can operate correctly when the voltage increases to 5 V.

Capable of withstanding 5 V means that when the USB-C port I/O circuit is deactivated, the circuit connected to the external terminal CC can withstand a voltage increase of up to 5 V.

In simple circuits of the conventional voltage divider type, there is at least one transistor that has to have a maximum absolute rating of 5 V to ensure the functionality and ability of the circuit to withstand 5 V.

However, there are technological sectors that do not provide for the manufacture of transistors having a maximum absolute rating of 5 V, where it is nevertheless desirable to be able to meet operating and tolerance constraints at 5 V in order to benefit from a USB-C port I/O circuit.

BRIEF SUMMARY

Embodiments and implementations propose a circuit functional at and capable of withstanding a maximum voltage, for example of 5 V, greater than a rated voltage, for example of 3.3 V, solely with transistors having a maximum absolute rating that is lower than the maximum voltage, for example substantially the same as the rated voltage.

According to one aspect, in this regard, a method is proposed for protecting, in an integrated circuit, an output circuit including a first transistor and a second transistor coupled in series between a terminal and an output stage, the terminal receiving a signal at a rated voltage level which can rise to a maximum voltage level, the method comprising a protection circuit generating a first voltage controlling the first transistor, and generating a second voltage controlling the second transistor, wherein:

- in an activated state, the first voltage and the second voltage are obtained by dividing the voltage level of said terminal; and
- in a deactivated state, the first voltage is obtained by the voltage level of said terminal, and the second voltage is obtained by the level of a control voltage minus a threshold voltage of a protection transistor.

In other words, the second voltage is capped at a level equal to the control voltage minus the threshold voltage, for example obtained by means of a "cascode" type circuit of transistors that may have a maximum absolute rating lower than the maximum voltage, but arranged so as to be functional at and capable of withstanding the maximum voltage.

It is thus possible to build a circuit, such as a voltage divider, that is functional at and capable of withstanding 5 V using only transistors having a maximum absolute rating of 3.3 V, i.e., without using "high-voltage" transistors having a maximum absolute rating of 5 V or more.

According to one implementation:

- in the activated state, the protection circuit and the output circuit are able to pass a current between the terminal and an earth terminal; and
- in the deactivated state, the protection circuit and the output circuit are unable to pass a current between the terminal and the earth terminal.

According to one embodiment, the first voltage is obtained by the drain voltage of a protection transistor and the second voltage is obtained by the source voltage of the protection transistor, the protection transistor being coupled between a first resistive element and a second resistive element of a voltage divider bridge.

According to another aspect, an integrated circuit is proposed including:

- a terminal designed to receive a signal at a rated voltage level which can rise to a maximum voltage level;
- an output circuit including a first transistor and a second transistor coupled in series between the terminal and an output stage; and
- a protection circuit designed to generate a first voltage controlling the first transistor, and a second voltage controlling the second transistor, such that:
  - in an activated state, the first voltage and the second voltage are obtained by dividing the voltage level of said terminal; and
  - in a deactivated state, the first voltage is obtained by the voltage level of said terminal, and the second voltage is obtained by the level of a control voltage minus a threshold voltage of a protection transistor.

According to one embodiment:

- in the activated state, the protection circuit and the output circuit are able to pass a current between the terminal and an earth terminal; and
- in the deactivated state, the protection circuit and the output circuit are unable to pass a current between the terminal and an earth terminal.

According to one embodiment, the protection circuit includes a resistive voltage divider bridge including a protection transistor coupled in series between a first resistive element and a second resistive element and designed to be controlled by the control voltage on its gate, the gate of the first transistor being coupled to the drain of the protection transistor, the gate of the second transistor being coupled to the source of the protection transistor.

According to one embodiment, the first resistive element is coupled between the terminal and the drain of the protection transistor, and the second resistive element is coupled between the source of the protection transistor and the earth terminal.

According to one embodiment, the protection transistor, the first transistor of the output circuit and the second transistor of the output circuit have a maximum absolute rating lower than the maximum voltage level.

According to one embodiment, the rated voltage is between 3.0 V and 3.6 V and the maximum voltage is between 4.7 V and 5.0 V.

According to another aspect, a system-on-chip is also proposed including an integrated circuit as defined above, in an input-output device of a USB-C port.

BRIEF DESCRIPTION OF THE SEVERAL VIEWS OF THE DRAWINGS

Other advantages and features of the disclosure will become apparent upon examining the detailed description of non-limiting embodiments and implementations, and from the accompanying drawings, wherein the figures:

FIG. 1 shows an exemplary circuit;

FIG. 2 shows the circuit described with reference to FIG. 1 in the activated state for a voltage at the terminal at the rated value;

FIG. 3 shows the circuit described with reference to FIG. 1 in the activated state for a voltage at the terminal at the maximum value;

FIG. 4 shows the circuit described with reference to FIG. 1 in the deactivated state for a voltage at the terminal at the rated value;

FIG. 5 shows the circuit described with reference to FIG. 1 in the deactivated state for a voltage at the terminal at the maximum value;

FIG. 6 schematically shows a system-on-chip having a network of input-output terminals and functional blocks.

DETAILED DESCRIPTION

FIG. 1 shows an exemplary DIV circuit, such as a divider, that is functional at and capable of withstanding a maximum voltage, of 5 V for example, including transistors all having a maximum absolute rating lower than 5 V, for example substantially 3.3 V.

The maximum absolute rating is the voltage value above which the transistor is at risk of breakdown when applied between two of its terminals.

For the transistors in the DIV circuit, we assume that the gate breakdown voltage, i.e., the maximum absolute rating between the gate terminal and the source/drain terminals, is the same as the junction breakdown voltage, i.e., the maximum absolute rating between the source and drain terminals.

An output circuit CRC_out of the divider DIV includes an output stage Ra-Nout-Rb, capable of dividing the voltage V_CC present at an input terminal. The output stage Ra-Nout-Rb is referred to as the "bridge divider".

The terminal is designed to receive a signal V_CC at a rated voltage level Vnml (FIGS. 2 and 4) which can rise to a maximum voltage level Vmax (FIGS. 3 and 5).

The voltage division is, for example, obtained by means of a series of resistive elements Ra, Rb, so as to supply the divided voltage V_CC_div at an output node Nout at a level equal to the ratio B/(A+B) of the voltage level of the input signal V_CC (where A is the value of the resistor Ra and B is the value of the resistor Rb).

For example, it is possible to choose the values A and B such that the ratio B/(A+B) is equal to ⅓, particularly in a detector application on the USB-C channel CC1/2 in power delivery mode, usually "USB PD CC". That said, the ratio of the resistors Ra, Rb implementing the voltage division at the output Nout can be chosen at any value without influencing the functionality and ability of the DIV circuit to withstand the maximum voltage.

The voltage of the input signal V_CC is transmitted to the divider bridge Ra, Rb via a first transistor TPcd and a second transistor TPcs coupled in series between the terminal V_CC and the resistor Ra of the output stage.

The first transistor TPcd and the second transistor TPcs are PMOS transistors (acronym commonly used for "P-type Metal Oxide Semiconductor").

The first transistor TPcd is controlled at its gate by a first so-called "cascode" voltage, V_CASCd, whilst the second transistor TPcs is controlled at its gate by a second voltage, also "cascode", V_CASCs.

The first cascode voltage V_CASCd and the second cascode voltage V_CASCd are generated by a protection circuit CRC_prot, in particular from the voltage V_CC of the input signal at the terminal.

The protection circuit CRC_prot includes a resistive voltage divider bridge R1-TNc-R2 including a protection transistor TNc coupled in series between a first resistive element R1 and a second resistive element R2.

For example, the first resistive element R1 is coupled between the terminal and the drain of the protection transistor TNc, and the second resistive element R2 is coupled between the source of the protection transistor TNc and the earth terminal GND.

In one example adapted for a rated voltage of substantially 3.3 V (for example, between 3.0 V and 3.6 V), and a maximum voltage of substantially 5 V (for example, between 4.7 V and 5.3 V), a ratio substantially equal to ⅓ will be chosen in the voltage divider of the protection circuit CRC_prot.

The protection transistor TNc is, for example, an NMOS transistor (acronym commonly used for "N-type Metal Oxide Semiconductor").

The protection transistor TNc is designed to be controlled by a control voltage V_CASC at its gate, also called "cascode voltage".

"Cascode voltage" means a control voltage, for example a static voltage, which places the transistor in a state that is substantially invariable with respect to the implementation of the functionality of the circuit to which it belongs.

In particular here, with the cascode control voltage V_CASC at the gate of the protection transistor TNc, the level of the source voltage "Vs" can be capped with respect to the drain voltage "Vd", the functionality of the circuit including the transistor being able to divide the terminal voltage V_CC.

Indeed, the source voltage Vs of the protection transistor TNc is capped at the level of the gate voltage "Vg" (Vg=V_CASC) minus the threshold value "Vt" of the protection transistor TNc.

In other words: $Vs \leq Vg - Vt = V\_CASC - Vt$.

The threshold voltage Vt of the protection transistor TNc is, for example, between 0.6 V and 0.8 V.

The cascode control voltage V_CASC is, for example, generated by an "external" supply circuit PWR_IO, for example the supply circuit of the integrated circuit including the divider DIV.

The cascode control voltage V_CASC is, for example, generated at the rated voltage level, independently of the actual voltage level V_CC at the terminal.

The first cascode voltage V_CASCd controlling the first transistor TPcd of the output circuit CRC_out is taken from the drain of the protection transistor TNc.

Respectively, the second cascode voltage V_CASCd controlling the second transistor TPcs of the output circuit CRC_out is taken from the source of the protection transistor TNc.

For example, in this regard, the gate (V_CASCd) of the first transistor TPcd is coupled to the drain of the protection transistor TNc; whilst the gate (V_CASCs) of the second transistor TPcs is coupled to the source of the protection transistor TNc.

Finally, NMOS, TNsw1, TNsw2, Tnsw3 transistors functioning as activation/deactivation switches in the divider circuit DIV are provided between an earth reference terminal GND and the protection circuit CRC_prot, the output circuit CRC_out and the output node Nout.

A first switch TNsw1 controlled by an activation signal V_EN can, for example, be coupled between the earth GND and the second resistive element R2 of the protection circuit CRC_prot.

A second switch TNsw2 controlled by the activation signal V_EN can, for example, be coupled between the earth GND and the resistive element Rb of the output circuit CRC_out.

A third switch TNsw3 controlled by the inverse of the activation signal V_EN can, for example, be coupled between the earth GND and the output node Nout of the output circuit CRC_out.

In this way, the activation signal V_EN and its inverse V_nEN put the DIV circuit either in the activated state ON (FIGS. 2 and 3), or in the deactivated state OFF (FIGS. 4 and 5).

In the activated state ON, the switches TNsw1, TNsw2 are controlled ON by the activation signal V_EN, and the third switch TNsw3 is controlled OFF by the inverse of the activation signal V_nEN.

Thus, in the activated state ON, the protection circuit CRC_prot and the output circuit CRC_out are able to pass a current between the terminal and the earth terminal GND.

In the deactivated state OFF, the switches TNsw1, TNsw2 are controlled OFF by the activation signal V_EN, and the third switch TNsw3 is controlled ON by the inverse of the activation signal V_nEN.

Thus, in the deactivated state OFF, the protection circuit CRC_prot and the output circuit CRC_out are unable to pass a current between the terminal and the earth terminal GND. In addition, the output node Nout is "short-circuited" to earth GND.

Consequently, this exemplary protection circuit CRC_prot makes it possible to implement this double functional condition:

In the activated state ON, the first cascode voltage V_CASCd and the second cascode voltage V_CASCs controlling the output circuit CRC_out are obtained by dividing (factor N/(N+2N)=⅓) the voltage level of the terminal V_CC. Reference is made, in this respect, to FIGS. 2 and 3 described below. And:

In the deactivated state OFF, the first cascode voltage V_CASCd controlling the output circuit CRC_out is obtained by the voltage level of the terminal V_CC; and the second cascode voltage V_CASCs controlling the output circuit CRC_out is capped by the level of the cascode control voltage V_CASC minus the threshold voltage Vt of the protection transistor TNc. Reference is made, in this respect, to FIGS. 4 and 5 described below.

FIG. 2 shows the DIV circuit described above with reference to FIG. 1 in the activated state ON, for a voltage at the terminal V_CC at the rated value Vnml.

The rated voltage Vnml can be between 3.0 V and 3.6 V, for example 3.3 V. The activation signal V_EN is set to 3.3 V and its inverse V_nEN to 0 V.

In this case, the control voltage V_CASC at 3.3 V controls the protection transistor TNc (NMOS type) with respect to its source voltage, in the on state.

The drain voltage V_CASCd of the transistor TNc is equal to dividing (by 3) the level V_CC at the terminal, i.e., 1.1 V, since the protection circuit CRC_prot is able to pass a current.

The source voltage V_CASCs of the transistor TNc is equal to the drain voltage V_CASCd, at 1.1V.

The first voltage V_CASCd at 1.1 V controls the first transistor TPcd (PMOS type) of the output circuit CRC_out in the on state; and similarly, the second voltage V_CASCd at 1.1 V controls the second transistor TPed (PMOS type) of the output circuit CRC_out in the on state.

The voltage V_CC at 3.3 V is thus transmitted to the output stage Ra-Nout-Rb and the division function of V_CC is implemented on the voltage V_CC_div at the output node Nout, here too because the output circuit CRC_out is able to pass a current.

FIG. 3 shows the DIV circuit described above with reference to FIG. 1 in the activated state ON, for a voltage at the terminal V_CC at the maximum value Vmax.

The maximum voltage Vmax can be between 4.7 V and 5.3 V, for example 5.0 V.

In this case, the control voltage V_CASC at 3.3 V controls the protection transistor TNc (NMOS type) with respect to its source voltage, in the on state.

The drain voltage V_CASCd of the transistor TNc is equal to dividing (by 3) the level V_CC at the terminal, i.e., substantially 1.7 V, since the protection circuit CRC_prot is able to pass a current.

The source voltage V_CASCs of the transistor TNc is equal to the drain voltage V_CASCd, at 1.7V.

The first voltage V_CASCd at 1.7 V controls the first transistor TPcd (PMOS type) of the output circuit CRC_out, with respect to its source voltage, in the on state; and similarly, the second voltage V_CASCd at 1.7 V controls the second transistor TPcd (PMOS type) of the output circuit CRC_out, with respect to its source voltage, in the on state.

The voltage V_CC at 5 V is thus transmitted to the output stage Ra-Nout-Rb and the division function of V_CC is implemented on the voltage V_CC_div at the output node Nout, here too because the protection circuit CRC_prot is able to pass a current.

Consequently, the DIV circuit is functional at the maximum voltage value V_CC.

FIG. 4 shows the DIV circuit described above with reference to FIG. 1 in the deactivated state OFF, for a voltage at the terminal V_CC at the rated value Vnml, for example 3.3 V.

In this case, since the protection circuit CRC_prot is unable to pass a current, the terminal voltage V_CC at 3.3 V is transmitted by resistive coupling to the conduction terminals (drain/source) of the protection transistor TNc.

The control voltage V_CASC at 3.3 V thus controls the protection transistor TNc (NMOS type), with respect to its source voltage, in the linear (or "ohmic") state, i.e., in a self-regulated manner at a source-gate voltage Vs-Vg equal to the threshold voltage Vt of the transistor TNc.

The drain voltage V_CASCd of the transistor TNc is equal to the level V_CC at the terminal, i.e., 3.3 V.

The source voltage V_CASCs of the transistor TNc is capped by the level of the cascode control voltage V_CASC minus the threshold voltage Vt of the protection transistor TNc, i.e., substantially 2.5 V.

The first voltage V_CASCd at 3.3 V controls the first transistor TPcd (PMOS type) of the output circuit CRC_out in the on state.

The second voltage V_CASCd at 2.5 V controls the second transistor TPed (PMOS type) of the output circuit CRC_out in the linear state, i.e., in a self-regulated manner at a source-gate voltage Vs-Vg equal to the threshold voltage Vtp of the second transistor TPcs. The threshold voltage Vtp of the P-type transistor has a minus sign, for example Vtp=−0.7 V.

The source voltage V_INT1 of the second transistor TPcs of the output circuit CRC_out can thus be capped at the second voltage V_CASCd minus the threshold voltage Vtp of the P-type transistor, TPcs, i.e., substantially 3.3V=2.5V−(−0.7V) (or between 3.0 V and 3.3 V in practice).

The output node Nout is connected to earth, and the voltage V_CC_div=0V is transmitted to the drain of the second transistor PMOS TPcs by resistive coupling via the resistor Ra.

FIG. 5 shows the DIV circuit described above with reference to FIG. 1 in the deactivated state OFF, for a voltage at the terminal V_CC at the maximum value Vmax, for example 5 V.

In this case, since the protection circuit CRC_prot is unable to pass a current, the terminal voltage V_CC at 5 V is transmitted by resistive coupling to the conduction terminals (drain/source) of the protection transistor TNc.

The control voltage V_CASC at 3.3 V thus controls the protection transistor TNc (NMOS type), with respect to its source voltage, in the linear (or "ohmic") state, i.e., in a self-regulated manner at a source-gate voltage Vs-Vg equal to the threshold voltage Vt of the transistor TNc.

The drain voltage V_CASCd of the transistor TNc is equal to the level V_CC at the terminal, i.e., 5 V.

The source voltage V_CASCs of the transistor TNc is capped by the level of the cascode control voltage V_CASC minus the threshold voltage Vt of the protection transistor TNc, i.e., substantially 2.5 V=3.3 V−0.7 V.

The first voltage V_CASCd at 5 V controls the first transistor TPcd (PMOS type) of the output circuit CRC_out in the on state.

The second voltage V_CASCd at 2.5 V controls the second transistor TPcd (PMOS type) of the output circuit CRC_out in the linear state, i.e., in a self-regulated manner at a source-gate voltage Vs-Vg equal to the threshold voltage Vtp of the second transistor TPcs. The threshold voltage Vtp of the P-type transistor has a minus sign, for example Vtp=−0.7 V.

The source voltage V_INT1 of the second transistor TPcs of the output circuit CRC_out can thus be capped at the second voltage V_CASCd minus the threshold voltage Vtp of the P-type transistor, TPcs, i.e., substantially 3.3V=2.5V−(−0.7V) (or between 3.3 V and 3.5 V in practice).

The output node Nout is connected to earth, and the voltage V_CC_div=0V is transmitted to the drain of the second transistor PMOS TPcs by resistive coupling via the resistor Ra.

Thus, in this case, none of the transistors of the DIV circuit are biased with a voltage greater than the breakdown voltage between each of their terminals.

In particular, neither the protection transistor, nor the first switch TNsw1, nor the two transistors TPcd, TPcs of the output circuit CRC_out are biased with a voltage greater than the breakdown voltage, for example 3.3 V (or even 3.5 V), between their conduction terminals, or between their gate terminal and the conduction terminals.

Consequently, the DIV circuit is capable of withstanding the maximum voltage value V_CC.

FIG. 6 schematically shows a system-on-chip SOC that may include a network of input-output terminals IO_RNG and various functional blocks.

The functional blocks can include a digital circuit DIG, for example a core or a processor; a memory circuit MEM, for example a "SRAM" type volatile memory and possibly an "EEPROM" or "Flash" type non-volatile memory; an analogue circuit ANL, for example for wireless communication or having a functionality for analogue detection of a physical quantity; a power supply circuit SUP, for example capable of supplying a regulated voltage, and which may include the power supply PWR_IO previously mentioned with reference to FIG. 1.

The network of input-output terminals IO_RNG includes in particular an input-output device IO_CC_CIRC able to control a terminal IO_CC_PIN of a port CC1/CC2 of a USB-C connection.

The input-output device IO_CC_CIRC includes in particular a detection means DET for voltage levels that require a divide-by-three solution for the voltage level V_CC at the terminal IO_CC_PIN.

The detection means DET incorporates in particular the divider circuit DIV, as described above with reference to FIGS. 1 to 5, which makes it possible to guarantee operation that is functional at and capable of withstanding the maximum voltage of 5 V (for a rated voltage of 3.3 V).

In addition, the input-output device IO_CC_CIRC includes internal terminals, INTRN_PIN for communicating with the functional blocks DIG-SUP of the system-on-chip SOC, for example according to conventional protocols I2C, AHB or AXI.

Thus, the operating and tolerance constraint at 5 V imposed by the USB PD CC standard on the input-output device IO_CC_CIRC does not prevent the system-on-chip SOC from being produced in a technological field that does not provide for the manufacture of transistors having a maximum absolute rating greater than or equal to 5 V. This can in particular be advantageous in terms of production costs and optimizing manufacturing processes.

Method for protecting, in an integrated circuit, an output circuit including a first transistor and a second transistor coupled in series between a terminal (IO_CC_PIN) and an output stage (Ra, Rb, Nout), the terminal (IO_CC_PIN) receiving a signal (V_CC) at a rated voltage level (Vnml) which can rise to a maximum voltage level (Vmax), the method may be summarized as including a protection circuit generating a first voltage (V_CASCd) controlling the first transistor, and generating a second voltage (V_CASCs) controlling the second transistor, wherein: in an activated state (ON), the first voltage (V_CASCd) and the second voltage (V_CASCs) are obtained by dividing the voltage level of said terminal (V_CC); in a deactivated state (OFF), the first voltage (V_CASCd) is obtained by the voltage level of said terminal (V_CC), and the second voltage (V_CASCs) is obtained by the level of a control voltage (V_CASC) minus a threshold voltage of a protection transistor (TNc).

In the activated state (ON), the protection circuit and the output circuit may be able to pass a current between the terminal and an earth terminal; and in the deactivated state (OFF), the protection circuit and the output circuit are unable to pass a current between the terminal and the earth terminal.

The first voltage (V_CASCd) may be obtained by the drain voltage of a protection transistor (TNc) and the second voltage (V_CASCs) may be obtained by the source voltage of the protection transistor (TNc), the protection transistor (TNc) being coupled between a first resistive element (R1) and a second resistive element (R2) of a voltage divider bridge (RDIV).

Integrated circuit may be summarized as including: a terminal (IO_CC_PIN) designed to receive a signal (V_CC) at a rated voltage level (Vnml) which can rise to a maximum voltage level (Vmax); an output circuit including a first transistor (TPcd) and a second transistor (TPcs) coupled in series between the terminal (IO_CC_PIN) and an output stage (Ra, Rb, Nout); and a protection circuit designed to generate a first voltage (V_CASCd) controlling the first transistor, and a second voltage (V_CASCs) controlling the second transistor, such that: in an activated state (ON), the first voltage (V_CASCd) and the second voltage (V_CASCs) are obtained by dividing the voltage level of said terminal (V_CC); and in a deactivated state (OFF), the first voltage (V_CASCd) is obtained by the voltage level of said terminal (V_CC), and the second voltage (V_CASCs) is obtained by the level of a control voltage (V_CASC) minus a threshold voltage of a protection transistor (TNc).

In the activated state (ON), the protection circuit and the output circuit may be able to pass a current between the terminal and an earth terminal; and in the deactivated state (OFF), the protection circuit and the output circuit may be unable to pass a current between the terminal and the earth terminal.

The protection circuit may include a resistive voltage divider bridge (RDIV) including a protection transistor (TNc) coupled in series between a first resistive element (R1) and a second resistive element (R2) and designed to be controlled by the control voltage (V_CASC) on its gate, the gate of the first transistor (V_CASCd) being coupled to the drain of the protection transistor, the gate of the second transistor (V_CASCs) being coupled to the source of the protection transistor.

The first resistive element (R1) may be coupled between the terminal (IO_CC_PIN) and the drain of the protection transistor (TNc), and the second resistive element (R2) may be coupled between the source of the protection transistor (TNc) and the earth terminal (GND).

The protection transistor (TNc), the first transistor (TPcd) of the output circuit and the second transistor (TPcs) of the output circuit may have a maximum absolute rating lower than the maximum voltage level.

The rated voltage may be between 3.0 V and 3.6 V and the maximum voltage may be between 4.7 V and 5.3 V.

System-on-chip (SOC) may include an integrated circuit, in an input-output device (IO_CC_CIRC) of a terminal (IO_CC_PIN) of a USB-C port.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for protecting, by an integrated circuit, an output circuit, wherein the output circuit includes a first transistor and a second transistor that are coupled in series between a terminal and an output stage, the terminal is configured to receive a signal at a rated voltage level that is capable of increasing to a maximum voltage level, and wherein the method comprises:

generating, by a protection circuit, a first voltage that controls the first transistor; and generating, by the protection circuit, a second voltage that controls the second transistor, wherein:

in an activated state, the first voltage and the second voltage are both generated by dividing the voltage level of the signal; and in a deactivated state, the first voltage is generated to be the same as the voltage level of the signal, the second voltage is generated to be a level of a control voltage minus a threshold voltage of a protection transistor, and the protection circuit and the output circuit are unable to pass a current between the terminal and a ground terminal.

2. The method according to claim 1, wherein in the activated state, the protection circuit and the output circuit pass the current between the terminal and the ground terminal.

3. The method according to claim 1, wherein the first voltage is obtained as a drain voltage of the protection transistor and the second voltage is obtained as a source voltage of the protection transistor.

4. The method according to claim 3, wherein the protection transistor is coupled between a first resistive element and a second resistive element of a voltage divider bridge.

5. An integrated circuit, comprising:

a terminal configured to receive a signal at a voltage level that is capable of increasing to a maximum voltage level;

an output circuit including a first transistor and a second transistor coupled in series between the terminal and an output stage; and a protection circuit configured to generate a first voltage that controls the first transistor and a second voltage that controls the second transistor, wherein:

in an activated state, the first voltage and the second voltage are both generated by dividing the voltage level of the signal;

in a deactivated state, the first voltage is generated to be the same as the voltage level of the terminal and the second voltage is generated to be a level of a control voltage minus a threshold voltage of a protection transistor; and the protection circuit includes a resistive voltage divider bridge including the protection transistor coupled in series between a first resistive element and a second resistive element, and wherein the protection transistor is configured to be controlled by the control voltage at a gate of the protection transistor.

6. The integrated circuit according to claim 5, wherein in the activated state, the protection circuit and the output circuit are able to pass a current between the terminal and a ground terminal.

7. The integrated circuit according to claim 5, wherein in the deactivated state, the protection circuit and the output circuit are unable to pass a current between the terminal and a ground terminal.

8. The integrated circuit according to claim 5, wherein a gate of the first transistor is coupled to a drain of the protection transistor, and a gate of the second transistor is coupled to a source of the protection transistor.

9. The integrated circuit according to claim 5, wherein the first resistive element is coupled between the terminal and a drain of the protection transistor, and the second resistive element is coupled between a source of the protection transistor and a ground terminal.

10. The integrated circuit according to claim 5, wherein the protection transistor, the first transistor of the output circuit and the second transistor of the output circuit have a maximum absolute rating that is lower than the maximum voltage level.

11. The integrated circuit according to claim 5, wherein a rated voltage of the signal is between 3.0 V and 3.6 V and the maximum voltage is between 4.7 V and 5.3 V.

12. A system-on-chip, comprising:

an input-output device of a terminal of a USB-C port; and an integrated circuit including:

a terminal configured to receive a signal at a voltage level that is capable of increasing to a maximum voltage level;

an output circuit including a first transistor and a second transistor coupled in series between the terminal and an output stage; and a protection circuit configured to generate a first voltage that controls the first transistor and a second voltage that controls the second transistor, wherein:

in an activated state, the first voltage and the second voltage are both generated by dividing the voltage level of the signal; and in a deactivated state, the first voltage is generated to be the same as the voltage level of the terminal and the second voltage is generated to be a level of a control voltage minus a threshold voltage of a protection transistor, and the protection circuit and the output circuit are unable to pass a current between the terminal and a ground terminal.

13. The system-on-chip according to claim 12, wherein in the activated state, the protection circuit and the output circuit are able to pass the current between the terminal and the ground terminal.

14. The system-on-chip according to claim 12, wherein the protection circuit includes a resistive voltage divider bridge including the protection transistor coupled in series between a first resistive element and a second resistive element, and wherein the protection transistor is configured to be controlled by the control voltage at a gate of the protection transistor.

15. The system-on-chip according to claim 14, wherein a gate of the first transistor is coupled to a drain of the protection transistor, and a gate of the second transistor is coupled to a source of the protection transistor.

16. The system-on-chip according to claim 14, wherein the first resistive element is coupled between the terminal and a drain of the protection transistor, and the second resistive element is coupled between a source of the protection transistor and a ground terminal.

17. The system-on-chip according to claim 12, wherein the protection transistor, the first transistor of the output circuit and the second transistor of the output circuit have a maximum absolute rating that is lower than the maximum voltage level.

* * * * *